(12) United States Patent
Chen et al.

(10) Patent No.: US 7,515,469 B1
(45) Date of Patent: Apr. 7, 2009

(54) COLUMN REDUNDANCY RAM FOR DYNAMIC BIT REPLACEMENT IN FLASH MEMORY

(75) Inventors: Alan Chen, Saratoga, CA (US); Neville Ichhaporia, San Jose, CA (US); Vijay P. Adusumilli, San Jose, CA (US); Stephen Trinh, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/862,436

(22) Filed: Sep. 27, 2007

(51) Int. Cl.
*G11C 16/06* (2006.01)
*G11C 16/04* (2006.01)

(52) U.S. Cl. .............................. 365/185.09; 365/185.33
(58) Field of Classification Search .............. 365/185.09
See application file for complete search history.

(56) References Cited

U.S. PATENT DOCUMENTS

| | | | |
|---|---|---|---|
| 5,381,370 A | 1/1995 | Lacey et al. | |
| 5,627,963 A * | 5/1997 | Gabillard et al. | 714/42 |
| 5,644,541 A | 7/1997 | Siu et al. | |
| 7,003,622 B2 * | 2/2006 | Shinohara et al. | 365/185.09 |
| 2002/0113251 A1 * | 8/2002 | Brady | 257/200 |

* cited by examiner

*Primary Examiner*—Son L Mai
(74) *Attorney, Agent, or Firm*—Schwegman, Lundberg & Woessner, P.A.

(57) ABSTRACT

A column redundancy system for a non-volatile memory includes a separate companion controller chip that includes a column redundancy RAM memory array for storing addresses of defective non-volatile memory cells. Column redundancy match logic provides a match output signal corresponding to a match of a particular user input address for the non-volatile memory with the address of a defective non-volatile memory cell, the collection of said addresses stored in the column redundancy RAM memory array. Column redundancy replacement logic, in response to a match output, dynamically substitutes correct data associated with a defective non-volatile memory cell into an I/O program or read data bit stream of the non-volatile memory chip.

23 Claims, 2 Drawing Sheets

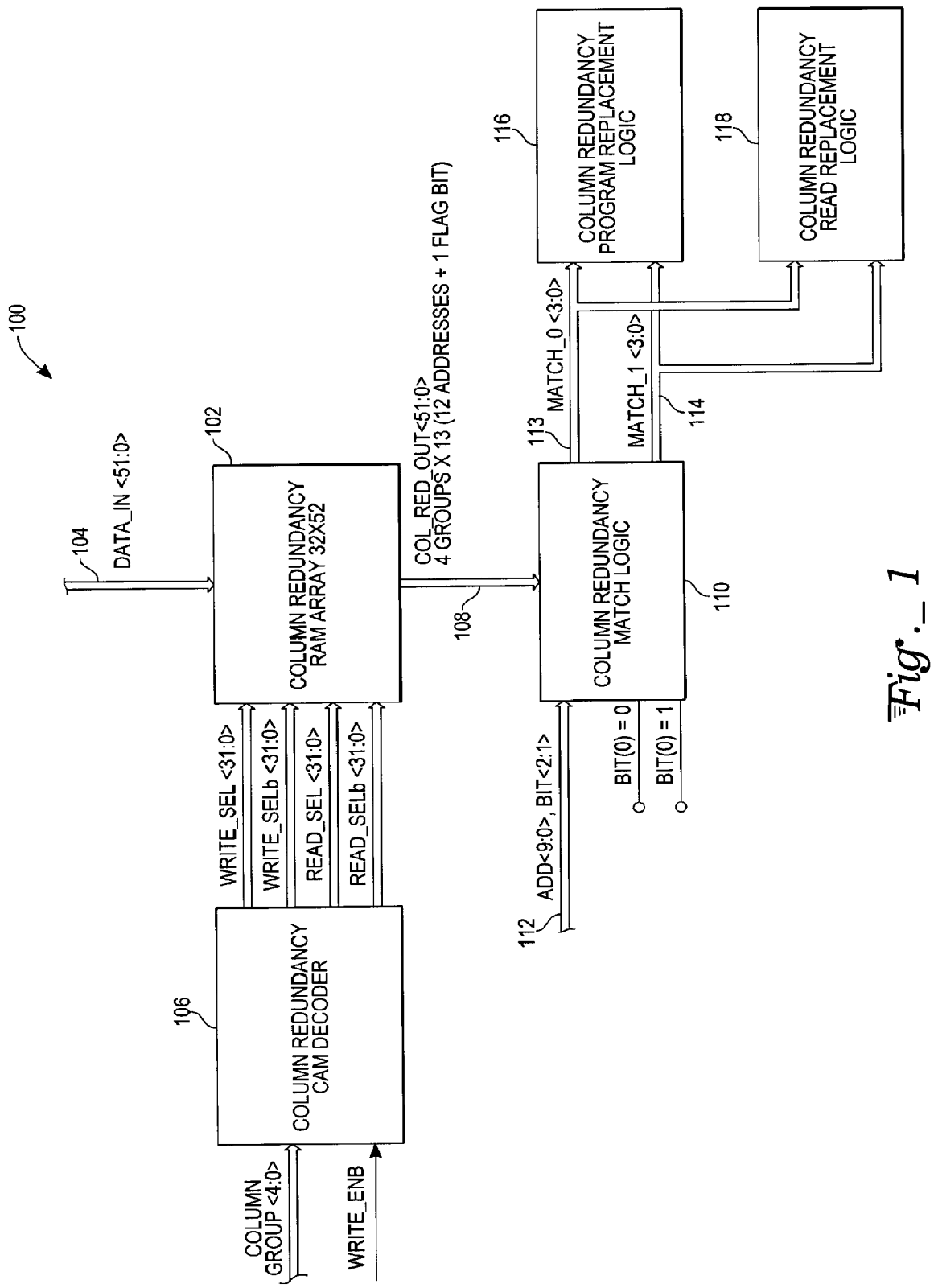
Fig. _ 1

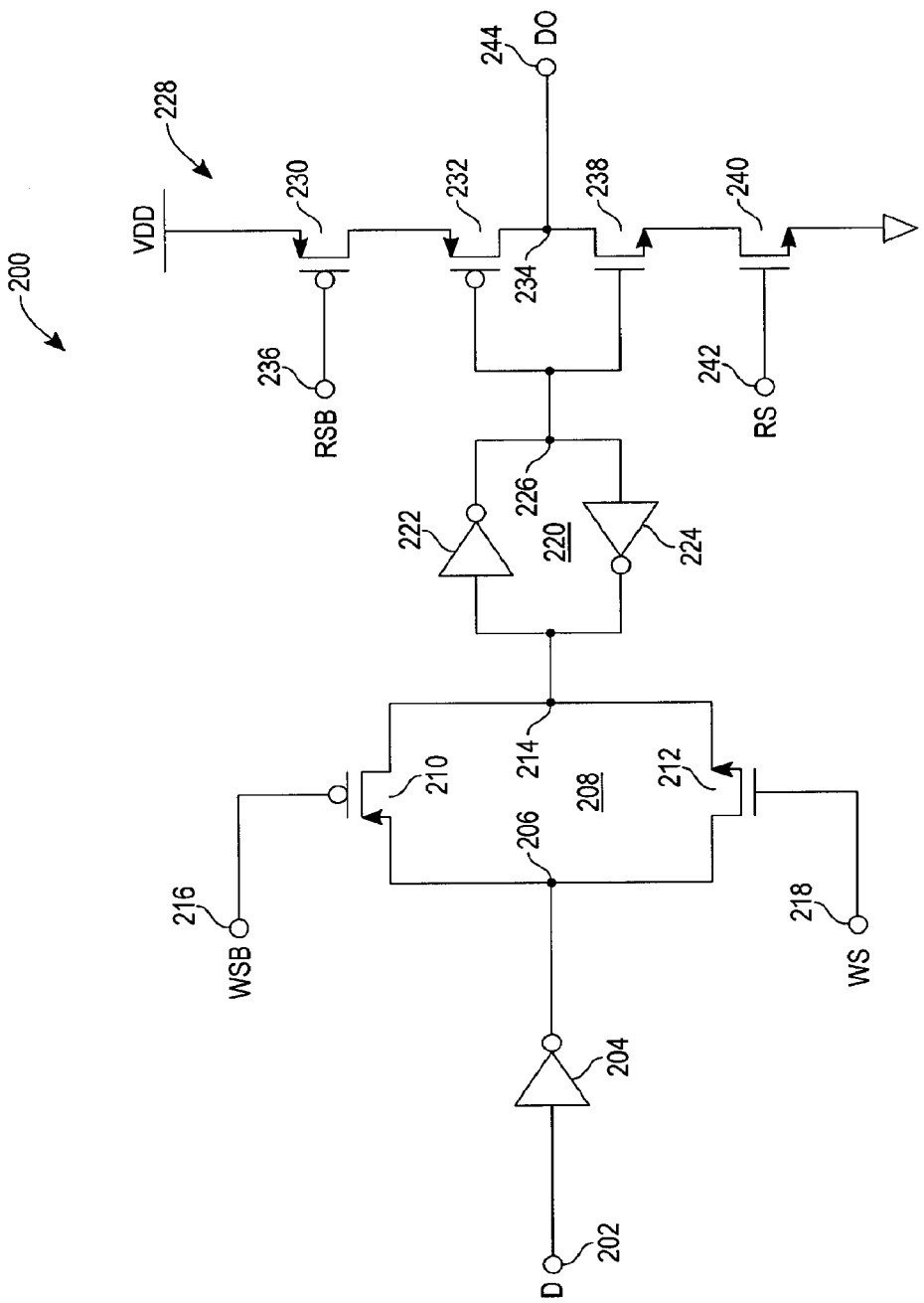
Fig._2

COLUMN REDUNDANCY RAM FOR DYNAMIC BIT REPLACEMENT IN FLASH MEMORY

TECHNICAL FIELD

This invention relates to non-volatile memories and, more particularly, to column redundancy for non-volatile memories.

BACKGROUND

Traditional column redundancy schemes use either a page-buffer (SRAM) or a multiplexer. In the first scheme, a page-buffer holds data while column redundancy is being processed. In the second scheme, control logic multiplexes data from a redundancy bitline when the column counter addresses a bitline with defective memory cells. Both of these column redundancy schemes require significant chip area and processing time, especially when the implementations use high voltage devices or are located close to a memory core.

A problem with using a memory controller logic chip with serial high-density FLASH memory chips is the under-utilization of the controller logic chip functions when serial data is clocked into or out of the FLASH memory chip. During these times, while a user has control of the system clock and data, not much is concurrently occurring in the controller logic chip aside from the opening of data paths to allow data to flow to or from the user. Replacement of redundant data, if not done during this clocking period, would have to be done before the next clocking period. The resulting increases in latency and chip area required for specialized redundancy logic become more problematic as demand grows for faster serial memories with higher densities.

SUMMARY OF THE INVENTION

In a first embodiment, a column redundancy system for a non-volatile memory includes a separate companion controller chip for controlling operational modes of the non-volatile memory chip. The separate companion controller chip includes a column redundancy RAM memory array for storing addresses of defective non-volatile memory cells. Column redundancy match logic compares user input addresses for the non-volatile memory to the stored addresses of defective non-volatile memory cells. An output signal, corresponding to a match of a particular user input address for the non-volatile memory with the stored address of a defective non-volatile memory cell, is provided to column redundancy replacement logic that performs dynamic substitution of correct data associated with the defective non-volatile memory cell into an I/O data bit stream of the non-volatile memory chip.

In another embodiment, a non-volatile memory chip provides an I/O data bit stream for programming data into or for reading data out of a non-volatile memory array. The non-volatile memory array includes column redundancy fuses for storing addresses of defective non-volatile memory cells. This embodiment includes the separate companion controller chip, the column redundancy match logic, and the column redundancy replacement logic of the first embodiment.

A method of providing column redundancy for a non-volatile memory chip includes controlling operational modes of the non-volatile memory chip with a separate companion controller chip; storing addresses of defective non-volatile memory cells in a column redundancy RAM memory array of the separate companion controller chip; comparing, with redundancy match logic, user input addresses for the non-volatile memory to the addresses of defective non-volatile memory cells stored in the column redundancy RAM memory array; providing from the redundancy match logic a match output signal corresponding to a match of a particular user input address for the non-volatile memory with the stored address of a defective non-volatile memory cell; and dynamically substituting, with column redundancy replacement logic in response to a match output signal from the column redundancy match logic, correct data associated with the defective non-volatile memory cell into an I/O data bit stream of the non-volatile memory chip.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a block diagram of a column redundancy system that uses a RAM memory for storing redundancy addresses in a separate controller chip.

FIG. 2 is a circuit diagram for one RAM latch circuit of a RAM memory for storing redundancy addresses in a separate controller chip.

DETAILED DESCRIPTION

FIG. 1 is a block diagram of a column redundancy system 100 that, in an exemplary embodiment, is in a controller chip that controls operation of a FLASH memory chip (not shown). An exemplary 2-chip column redundancy architecture includes the FLASH memory chip and the companion controller chip. The FLASH memory chip has sets of column redundancy fuses that are programmed to contain the addresses of defective FLASH memory cells. The FLASH memory is provided, for example, with 32 column groups, where each column group has four redundant columns. Note that the size of the FLASH memory and the number of redundant columns per column group may vary to meet the requirements of a particular memory system. In an exemplary embodiment, each set of column redundancy fuses has 12 address bits and 1 flag bit. (These bits may vary in other embodiments.) The column redundancy system 100 of the companion controller chip is provided with a column redundancy RAM array 102 that has, for example, 32 rows of 52 bits. Each row of the exemplary RAM 102, corresponding to a column group in the FLASH memory chip, stores the 12 address bits and 1 flag bit for each of 4 defective memory locations in the given column group.

During a READ or a PROGRAM mode of operation of the FLASH memory, the column redundancy system in the companion controller chip compares user-specified addresses with addresses in the RAM 102 to determine whether the memory contents for a bad memory address are to be dynamically replaced with corrected bits from the redundant columns. In a READ mode of operation, during which FLASH memory data is transferred from the main FLASH memory to an external user, the column redundancy system 100 dynamically replaces the redundant bits before they are sent to the output.

Upon startup, a data input bus 104 is used to load the RAM 102 from the FLASH fuses with the column redundancy fuse information as 52 bits of DATA_IN<51:0>. For writing the 52 bits of DATA_IN<51:0> into a particular row of the RAM 102, a corresponding one of the 32 rows of the RAM 102 is selected using one of the 32 pairs of write select signals WRITE_SEL<31:0> and complementary write select signals WRITE_SELb<31:0>. In response to a 5-bit COLUMN GROUP <4:0> signal and a HIGH WRITE_ENB, a column redundancy CAM decoder 106 provides one of the pairs of write select signals WRITE_SEL<31:0> and complementary write select signals WRITE_SELb<31:0>.

When the FLASH memory is to be programmed with user data or to be read out to the user, the fuse information is read out of the RAM 102 to COLUMN REDUNDANCY MATCH LOGIC 110 on a data output bus 108. The read out fuse data are provided on the data output bus 108 as 52 bits of a COL_RED_OUT<51:0> signal consisting of four groups of 13 bits each (12 address bits and 1 flag bit). For reading out fuse data for a particular row from the RAM 102, one of the 32 rows of the RAM 102 is selected using one of 32 pairs of read select signals READ_SEL<31:0> and complementary read select signals READ_SELb<31:0>. In response to the 5-bit COLUMN GROUP <4:0> and a LOW WRITE_ENB, the column redundancy CAM decoder 106 provides one of the pairs of read select signals READ_SEL<31:0> and the complementary read select signals READ_SELb<31:0>.

User addresses, uniquely identifying a data byte, are provided to the COLUMN REDUNDANCY MATCH LOGIC 110 on a 12-bit input address bus 112 as addresses ADD<9:0>, BIT<2:1>. Using an additional input bit BIT(0), each byte is handled as two 4-bit nibbles, an odd nibble composed of all odd bits (7, 5, 3, 1) and an even nibble composed of all even bits (6, 4, 2, 0). To select an even nibble, BIT(0) is set to 0. To select an odd nibble, BIT(0) is set to 1. If a match occurs in the COLUMN REDUNDANCY MATCH LOGIC 110 for an input address on the 12-bit input bus 112 and the even nibble is selected (BIT(0)=0), a 4-bit match signal MATCH_0<3:0> for the even nibble is provided on an output bus 113. If a match occurs in the COLUMN REDUNDANCY MATCH LOGIC 110 for an input address on the 12-bit input bus 112 and the odd nibble is selected (BIT(0)=1), a 4-bit match signal MATCH_1<3:0> for the odd nibble is provided on an output bus 114.

For a program mode of operation in which user data are stored into the FLASH memory, the MATCH_0<3:0> or the MATCH_1<3:0> signals are received by a COLUMN REDUNDANCY PROGRAM REPLACEMENT LOGIC block 116 that is activated to place redundant bits in redundant column storage in the FLASH memory.

For a read mode of operation in which data are retrieved for a user from the FLASH memory, the MATCH_0<3:0> or the MATCH_1<3:0> signals are received by a COLUMN REDUNDANCY READ REPLACEMENT LOGIC block 118 that is activated to provide a user with redundant bits from redundant column storage in the FLASH memory while the data stored in the FLASH memory are being read out to the user.

FIG. 2 illustrates one latch circuit, or RAM cell, 200 that is used for each memory cell of the exemplary 32×52 column redundancy RAM array 102 of FIG. 1. An input data bit, which is one of the DATA_IN<51:0> bits on the data input bus 104 from the FLASH memory redundancy fuses, is coupled through a data-in D terminal 202 to an input terminal of an input inverter 204. An output terminal of the input inverter 204 is coupled to an input terminal 206 of a transmission gate 208. The transmission gate 208 is formed with a PMOS transistor 210 and an NMOS transistor 212 that are both coupled between the transmission gate input terminal 206 and a transmission gate output terminal 214. A gate of the PMOS transistor 210 is coupled to a complementary write select WSB terminal 216 at which is provided one of the 32 WRITE_SELb<31:0> signals of FIG. 1. A gate of the NMOS transistor 212 is coupled to a write select WS terminal 218 at which is provided one of the 32 WRITE_SEL<31:0> signal of FIG. 1. A HIGH input signal at the WS input terminal 218 turns on the NMOS transistor 212 and a complementary LOW signal at the WSB input terminal 216 turns on the PMOS transistor 210. Similarly, a LOW input signal at the WS input terminal 218 turns off the NMOS transistor 212 and a complementary HIGH signal at the WSB input terminal 216 turns off the PMOS transistor 210.

A latch circuit 220 is formed with a pair of cross-coupled inverters 222, 224. Both the input terminal of the inverter 222 and the output terminal of the inverter 224 are coupled to the transmission gate output terminal 214. Both the output terminal of the inverter 222 and the input terminal of the inverter 224 are coupled to output terminal 226 of the latch circuit 220. When the PMOS transistor 210 and the NMOS transistor 212 are turned on, a data bit at the data-in D terminal 202 is passed through the inverter 204 and the transmission gate 208 and latched into the output terminal 226 of the latch circuit 220.

An output tri-state inverter 228 includes a first PMOS transistor 230 and a second PMOS transistor 232 connected in series between a VDD voltage source and an output terminal 234 of the output inverter 228. A gate of the first PMOS transistor 230 is coupled to a complementary read select RSB input terminal 236. A gate of the second PMOS transistor 232 is coupled to the output terminal 226 of the latch circuit 220. The output tri-state inverter 228 also includes a first NMOS transistor 238 and a second NMOS transistor 240 connected in series between the output terminal 234 and a ground terminal. A gate of the first NMOS transistor 238 is coupled to the output terminal 226 of the latch circuit 220. A gate of the second NMOS transistor 240 is coupled to a read select RS input terminal 242.

The output terminal 234 of the output inverter 228 is coupled to one of the output DO terminals 244 for one of the 52 COL_RED_OUT<51:0> signals of FIG. 1. The RSB signal at terminal 236 corresponds to one of the 32 READ_SELb<31:0> signals of FIG. 1. Similarly, the RS signal at terminal 242 corresponds to a respective one of the 32 READ_SEL<31:0> signals of FIG. 1. A HIGH level for a READ_SEL signal at the RS input terminal 242 turns on the second NMOS transistor 240. A corresponding complementary LOW signal for a READ_SELb signal at the RSB input terminal 236 also turns on the first PMOS transistor 230. The tri-state output inverter 228 is activated by turning on the second PMOS transistor 232 and by turning on the first NMOS transistor 238. An activated tri-state output inverter 228 couples the data bit at the latch output terminal 226 of the latch circuit 220 to the data output DO terminal 244. Note that DO is an inversion of D.

To disable the tri-state output inverter 228, a LOW level for a READ_SEL signal at the RS input terminal 242 turns off the second NMOS transistor 240. A corresponding complementary HIGH signal for a READ_SELb signal at the RSB input terminal 236 also turns off the first PMOS transistor 230.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A column redundancy system for a non-volatile memory, the system comprising:
    a separate companion controller chip for controlling operational modes of the non-volatile memory chip, the separate companion controller chip including a column redundancy RAM memory array for storing addresses of defective non-volatile memory cells;
    column redundancy match logic configured to compare user input addresses for the non-volatile memory to addresses of defective non-volatile memory cells stored in a column redundancy RAM memory array and configured to provide a match output signal corresponding to a match of a particular user input address for the non-volatile memory with the address of a defective non-volatile memory cell stored in the column redundancy RAM memory array; and
    column redundancy replacement logic, in response to a match output signal from the column redundancy match logic, configured to dynamically substitute correct data associated with a defective non-volatile memory cell into an I/O data bit stream of a non-volatile memory chip.

2. The column redundancy system of claim 1 wherein the column redundancy replacement logic includes column redundancy replacement logic configured to program the non-volatile memory with redundant data for defective non-volatile memory cells, said redundant data stored in redundant columns of the non-volatile memory; and
    wherein the column redundancy replacement logic includes column redundancy replacement logic configured to read the non-volatile memory with redundant data for defective non-volatile memory cells, said redundant data stored in redundant columns of the non-volatile memory.

3. The column redundancy system of claim 1 wherein the column redundancy replacement logic, in response to a match output signal from the column redundancy match logic, substitutes correct data associated with a defective non-volatile memory cell into an I/O data bit stream of the non-volatile memory chip for a program mode of operation, a read mode of operation, and an erase mode of operation for the non-volatile memory chip.

4. The column redundancy system of claim 1 wherein the column redundancy match logic compares addresses for a portion of a memory data byte stored in the non-volatile memory.

5. The column redundancy system of claim 4 wherein the portion of a memory data byte stored in the non-volatile memory is a nibble.

6. The column redundancy system of claim 1 wherein the addresses stored in the redundancy RAM memory array of defective non-volatile memory cells are transferred from fused addresses of defective non-volatile memory cells, said addresses originally stored in the non-volatile memory chip.

7. The column redundancy system of claim 1 wherein the non-volatile memory chip is a FLASH memory chip.

8. The column redundancy system of claim 1 wherein each memory cell of the column redundancy RAM memory array includes an input transmission gate activated by a write command signal, a cross-coupled inverter latch configured to store a bit, and a gated output circuit that is activated by a read command signal.

9. A column redundancy system for a non-volatile memory, the system comprising:
    a non-volatile memory chip providing an I/O data bit stream for programming data into or for reading data out of a non-volatile memory array that includes column redundancy fuses for storing addresses of defective non-volatile memory cells;
    a separate companion controller chip configured to control operational modes of the non-volatile memory chip, the separate companion controller chip including a column redundancy RAM memory array for storing addresses of defective non-volatile memory cells;
    column redundancy match logic configured to compare user input addresses for the non-volatile memory to the addresses of defective non-volatile memory cells stored in the column redundancy RAM memory array and configured to provide a match output signal corresponding to a match of a particular user input address for the non-volatile memory with the address of a defective non-volatile memory cell, the collection of said addresses stored in the column redundancy RAM memory array; and
    column redundancy replacement logic, in response to a match output signal from the column redundancy match logic, configured to dynamically substitute correct data associated with a defective non-volatile memory cell into an I/O data bit stream of the non-volatile memory chip.

10. The column redundancy system of claim 9 wherein the column redundancy replacement logic includes column redundancy replacement logic for programming the non-volatile memory with redundant data for defective non-volatile memory cells, said redundant data stored in redundant columns of the non-volatile memory.

11. The column redundancy system of claim 9 wherein the column redundancy replacement logic includes column redundancy replacement logic for reading the non-volatile memory with redundant data for defective non-volatile memory cells, said redundant data stored in redundant columns of the non-volatile memory.

12. The column redundancy system of claim 9 wherein the column redundancy replacement logic, in response to a match output signal from the column redundancy match logic, substitutes correct data associated with a defective non-volatile memory cell into an I/O data bit stream of the non-volatile memory chip for a program mode of operation, a read mode of operation, and an erase mode of operation for the non-volatile memory chip.

13. The column redundancy system of claim 9 wherein the column redundancy match logic compares addresses for a portion of a memory data byte stored in the non-volatile memory.

14. The column redundancy system of claim 13 wherein the portion of a memory data byte stored in the non-volatile memory is a nibble.

15. The column redundancy system of claim 9 wherein the addresses stored in the redundancy RAM memory array of defective non-volatile memory cells are transferred from fused addresses of defective non-volatile memory cells originally stored in the non-volatile memory chip.

16. The column redundancy system of claim 9 wherein the non-volatile memory chip is a FLASH memory chip.

17. A method of providing column redundancy for a non-volatile memory chip, the method comprising the steps of:
    controlling operational modes of the non-volatile memory chip with a separate companion controller chip;

storing addresses of defective non-volatile memory cells in a column redundancy RAM memory array of the separate companion controller chip;

comparing, with redundancy match logic, user input addresses for the non-volatile memory to the addresses of defective non-volatile memory cells, said addresses stored in the column redundancy RAM memory array;

providing from the redundancy match logic a match output signal corresponding to a match of a particular user input address for the non-volatile memory with the address of a defective non-volatile memory cell, the collection of said addresses stored in the column redundancy RAM memory array; and dynamically substituting, with column redundancy replacement logic in response to a match output signal from the column redundancy match logic, correct data associated with the defective non-volatile memory cell into an I/O data bit stream of the non-volatile memory chip.

18. The method of claim 17 including programming the non-volatile memory, using the column redundancy replacement logic, with redundant data for defective non-volatile memory cells, said redundant data stored in redundant columns of the non-volatile memory; and reading the non-volatile memory, using the column redundancy replacement logic, with redundant data for defective non-volatile memory cells being stored in redundant columns of the non-volatile memory.

19. The method of claim 17 including substituting correct data associated with a defective non-volatile memory cell into the I/O data bit stream of the non-volatile memory chip for a program mode of operation, a read mode of operation, and an erase mode of operation for the non-volatile memory chip, using the column redundancy replacement logic, in response to a match output signal from the column redundancy match logic.

20. The method of claim 17 including comparing, with the column redundancy match logic, addresses for a portion of a memory data byte stored in the non-volatile memory.

21. The method of claim 20 wherein the portion of a memory data byte stored in the non-volatile memory is a nibble.

22. The method of claim 17 including transferring addresses stored in the redundancy RAM memory array from fused addresses of defective non-volatile memory cells originally stored in the non-volatile memory chip.

23. The method of claim 17 wherein the non-volatile memory chip is a FLASH memory chip.

* * * * *